United States Patent
Steinmann et al.

(10) Patent No.: US 9,583,596 B2
(45) Date of Patent: Feb. 28, 2017

(54) DRAIN EXTENDED CMOS WITH COUNTER-DOPED DRAIN EXTENSION

(71) Applicant: Texas Instruments Incorporated, Dallas, TX (US)

(72) Inventors: Philipp Steinmann, Richardson, TX (US); Amitava Chatterjee, Plano, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/949,241

(22) Filed: Nov. 23, 2015

(65) Prior Publication Data

US 2016/0079392 A1 Mar. 17, 2016

Related U.S. Application Data

(62) Division of application No. 14/073,530, filed on Nov. 6, 2013, now Pat. No. 9,231,054, which is a division of application No. 13/288,690, filed on Nov. 3, 2011, now Pat. No. 8,592,900.

(60) Provisional application No. 61/409,594, filed on Nov. 3, 2010.

(51) Int. Cl.
| | | |
|---|---|---|
| *H01L 21/00* | (2006.01) | |
| *H01L 29/66* | (2006.01) | |
| *H01L 29/161* | (2006.01) | |
| *H01L 29/167* | (2006.01) | |
| *H01L 29/78* | (2006.01) | |
| *H01L 29/861* | (2006.01) | |
| *H01L 29/08* | (2006.01) | |
| *G06F 17/50* | (2006.01) | |
| *H01L 29/10* | (2006.01) | |

(52) U.S. Cl.
CPC .... *H01L 29/66681* (2013.01); *G06F 17/5081* (2013.01); *H01L 29/0878* (2013.01); *H01L 29/161* (2013.01); *H01L 29/167* (2013.01); *H01L 29/66659* (2013.01); *H01L 29/66734* (2013.01); *H01L 29/7813* (2013.01); *H01L 29/7816* (2013.01); *H01L 29/7835* (2013.01); *H01L 29/861* (2013.01); *H01L 29/1045* (2013.01)

(58) Field of Classification Search
CPC ........... H01L 29/66681; H01L 29/0878; H01L 29/7816
See application file for complete search history.

(56) References Cited

U.S. PATENT DOCUMENTS

| | | | | |
|---|---|---|---|---|
| 4,590,663 | A * | 5/1986 | Haken | ............... H01L 21/02238 257/336 |
| 5,141,890 | A * | 8/1992 | Haken | ............... H01L 21/02238 257/336 |
| 6,514,839 | B1 * | 2/2003 | Ker | ..................... H01L 21/8222 257/E21.608 |

(Continued)

*Primary Examiner* — Laura Menz
(74) *Attorney, Agent, or Firm* — Jacqueline J. Garner; Charles A. Brill; Frank D. Cimino (57) ABSTRACT

An integrated circuit containing a diode with a drift region containing a first dopant type plus scattering centers. An integrated circuit containing a DEMOS transistor with a drift region containing a first dopant type plus scattering centers. A method for designing an integrated circuit containing a DEMOS transistor with a counter doped drift region.

11 Claims, 6 Drawing Sheets

(56) References Cited

U.S. PATENT DOCUMENTS

| | | | | |
|---|---|---|---|---|
| 6,670,685 B2* | 12/2003 | Pendharkar | H01L 29/0619 | 257/339 |
| 6,884,686 B2* | 4/2005 | Pendharkar | H01L 29/0619 | 257/E21.427 |
| 7,238,986 B2* | 7/2007 | Pendharkar | H01L 29/0847 | 257/327 |
| 7,514,329 B2* | 4/2009 | Pendharkar | H01L 29/0847 | 438/286 |
| 7,602,029 B2* | 10/2009 | Mallikarjunaswamy | H01L 27/115 | 257/314 |
| 7,692,239 B2* | 4/2010 | Nagaoka | H01L 29/0634 | 257/335 |
| 7,745,294 B2* | 6/2010 | Pendharkar | H01L 21/823814 | 257/344 |
| 7,888,732 B2* | 2/2011 | Denison | H01L 29/0653 | 257/328 |
| 8,067,288 B2* | 11/2011 | Mallikarjunaswamy | H01L 27/115 | 365/145 |
| 8,173,510 B2* | 5/2012 | Denison | H01L 29/0653 | 257/330 |
| 8,232,158 B2* | 7/2012 | Benaissa | H01L 21/823814 | 257/338 |
| 8,404,551 B2* | 3/2013 | Ranade | H01L 29/105 | 257/368 |
| 8,592,900 B2* | 11/2013 | Steinmann | H01L 29/161 | 257/335 |
| 9,231,054 B2* | 1/2016 | Steinmann | H01L 29/161 | |
| 2003/0089951 A1* | 5/2003 | Ker | H01L 21/8222 | 257/355 |
| 2003/0219949 A1* | 11/2003 | Pendharkar | H01L 29/0619 | 438/299 |
| 2004/0079975 A1* | 4/2004 | Pendharkar | H01L 29/0619 | 257/288 |
| 2005/0098846 A1* | 5/2005 | Nagaoka | H01L 29/0634 | 257/487 |
| 2005/0253191 A1* | 11/2005 | Pendharkar | H01L 29/0847 | 257/335 |
| 2006/0024911 A1* | 2/2006 | Mehrad | H01L 21/82387 | 438/424 |
| 2006/0113592 A1* | 6/2006 | Pendharkar | H01L 29/0847 | 257/335 |
| 2009/0256212 A1* | 10/2009 | Denison | H01L 29/0653 | 257/408 |
| 2010/0065823 A1* | 3/2010 | Edwards | H01L 27/0629 | 257/24 |
| 2010/0093140 A1* | 4/2010 | Edwards | H01L 27/0629 | 438/237 |
| 2010/0117150 A1* | 5/2010 | Pendharkar | H01L 21/823814 | 257/337 |
| 2010/0327335 A1* | 12/2010 | Benaissa | H01L 27/092 | 257/300 |
| 2011/0012196 A1* | 1/2011 | Williams | H01L 21/761 | 257/343 |
| 2011/0101416 A1* | 5/2011 | Schulze | H01L 29/0834 | 257/139 |
| 2011/0127572 A1* | 6/2011 | Edwards | H01L 27/0629 | 257/105 |
| 2011/0151634 A1* | 6/2011 | Denison | H01L 29/0653 | 438/270 |
| 2011/0156144 A1* | 6/2011 | Benaissa | H01L 21/823814 | 257/338 |
| 2012/0098065 A1* | 4/2012 | Pendharkar | H01L 29/0847 | 257/343 |
| 2012/0112275 A1* | 5/2012 | Steinmann | H01L 29/161 | 257/335 |
| 2012/0139051 A1* | 6/2012 | Ranade | H01L 29/105 | 257/368 |
| 2012/0261766 A1* | 10/2012 | Benaissa | H01L 21/823814 | 257/369 |
| 2013/0161743 A1* | 6/2013 | Ranade | H01L 29/105 | 257/344 |
| 2013/0168766 A1* | 7/2013 | Lee | H01L 29/1083 | 257/335 |
| 2014/0061785 A1* | 3/2014 | Steinmann | H01L 29/161 | 257/337 |
| 2014/0273482 A1* | 9/2014 | Tsuchiya | H01L 29/4236 | 438/709 |
| 2016/0079392 A1* | 3/2016 | Steinmann | H01L 29/161 | 438/286 |

* cited by examiner

DRAIN EXTENDED CMOS WITH COUNTER-DOPED DRAIN EXTENSION

This application is a division of U.S. Nonprovisional application Ser. No. 14/073,530, "Drain Extended CMOS with Counter-Doped Drain Extension" filed Nov. 6, 2013, which is a division of U.S. Nonprovisional application Ser. No. 13/288,690, "Drain Extended CMOS with Counter-Doped Drain Extension", filed Nov. 3, 2011, which claims the benefit of U.S. Provisional Application No. 61/409,594, "Drain Extended CMOS with Counter-Doped Drain Extension", filed Nov. 3, 2010, all of which are incorporated herein by reference in their entireties.

FIELD OF THE INVENTION

This invention relates to the field of integrated circuits. More particularly, this invention relates to diodes and drain extended CMOS transistors.

BACKGROUND OF THE INVENTION

Modern digital VLSI circuits commonly operate at 1.2 volts or below. However, circuit requirements often call for design and interface with other circuits operating at higher voltages. Example circuits are input/output interface circuits with various off-chip system components such as power management switches, analog input circuits conditioning transducer signals, or output analog drive functions for speakers or other actuators.

One solution to this problem is to use two gate oxide thicknesses and to build both low voltage and high voltage transistors on the same chip. This method increases process complexity and cost. An alternative solution is to use drain extended (DE) MOS transistors that can operate at much higher drain voltages without significant loss in performance and without added process complexity and cost. In a DEMOS transistor a lightly doped extended drain region is constructed between the heavily doped drain contact and the transistor channel region. A depletion region forms in this lightly doped extension causing a voltage drop between the drain contact and the transistor gate. With proper design sufficient voltage may be dropped between the drain contact and the gate to allow a low voltage transistor to be used as a switch for the high voltage.

It is difficult to scale DEMOS transistors because the size of the lightly doped region is determined by the amount of voltage drop required to protect the low voltage gate oxide. To accommodate higher voltages, longer drain extensions or lower doping is required. Longer extensions and lower doping increases the series resistance of the transistor reducing performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

Adding scattering centers to the drift region of a pn diode raises the breakdown voltage.

Adding scattering centers to the drift region of an extended drain (DEMOS) transistor raises the breakdown voltage.

A method of designing a counter doped drift region of a DEMOS transistor.

DETAILED DESCRIPTION OF EMBODIMENTS

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

This invention involves adding scattering centers into the depletion region of a diode where the peak electric field forms to reduce the mean free path of the carriers and raise the breakdown voltage, Vb, of the diode. This enables a higher voltage to be applied to the diode or enables the diffusion doping to be increased thus reducing the resistance.

The term "scattering centers" refers to atoms within a semiconductor that reduce the mean free path of carriers within the semiconductor. These may include interstitial and non interstitial atoms. For example, interstitial silicon, germanium, arsenic, and indium atoms may reduce the mean free path of carriers in a silicon semiconductor.

Figure 1:
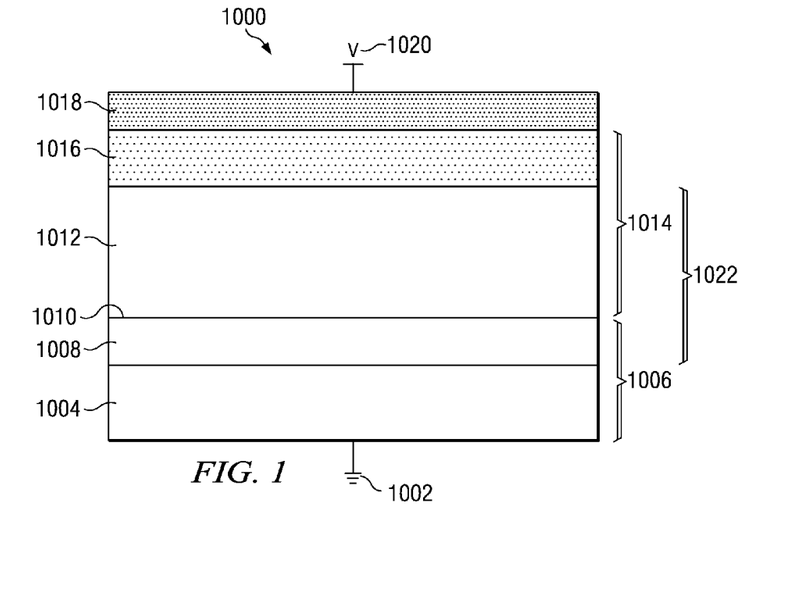
FIG. 1 shows a cross-sectional view of a diode according to an embodiment of the invention.

An example diode 1000 is shown in FIG. 1. A reverse biased pn diode with a positive voltage applied n-doped diffusion is used for illustration, but a reverse biased pn diode with a negative voltage applied to the p-doped diffusion may be used as well. The pn diode may be formed on a p-type substrate 1006 by implanting an n-type dopant such as phosphorus or arsenic to form n-doped regions 1014 and 1018 on top of the p-doped substrate 1006. N-doped region 1014 may be a lightly doped region with approximately $1E+16/cm^3$ donor (n-type) dopants and highly doped region 1018 may have approximately $2E+20/cm^3$ donor (n-type) dopants. The p-type region 1006 may also consist of a highly doped (about $2E+20/cm^3$ acceptor dopants) region and lightly doped (about $1E+16/cm^3$ acceptor dopants) region or it may consist of a highly doped or medium doped (~$1E18/cm^3$ acceptor dopants) region. In FIG. 1 a medium doped p-type region 1006 is used for illustration. A pn junction 1010 forms where the silicon changes from p-type to n-type. When a voltage 1020 is applied across the pn junction 1010, a depletion region 1022, across which the voltage is dropped, forms. The depletion region 1022 is essentially devoid of carriers. A small reverse bias current flows within the depletion region due to spontaneous electron hole pair production, but these carriers are immediately swept out of the depletion region by the applied electric field. The electrons are accelerated toward the positive terminal 1020 and the holes are accelerated toward the negative or ground terminal 1002. If the applied voltage 1020 is sufficiently high the carriers which are accelerated by the electric field and may gain sufficient energy to cause impact ionization. Impact ionization occurs when an energetic electron upon impact, imparts sufficient energy to a covalent bonded electron to raise that electron from the valence band into the conduction band. At high electric fields, impact ionization may cause the number of carriers in the conduction band to multiply rapidly resulting in high current, high heat generation, and diode breakdown. The voltage at which this occurs is the diode breakdown voltage, Vb.

The width of the depletion region (WD) 1020 is determined by the n-type, and p-type doping. Since an equal number of active carriers are removed from both the n-type, 1012, and p-type, 1008, portions of the depletion regions, their width are equal if the n-type and p-type doping is equal. If the n-type and p-type doping is not equal, the depletion width of the more lightly doped region is larger, since it requires more volume to remove an equal number of carriers.

Figure 2:
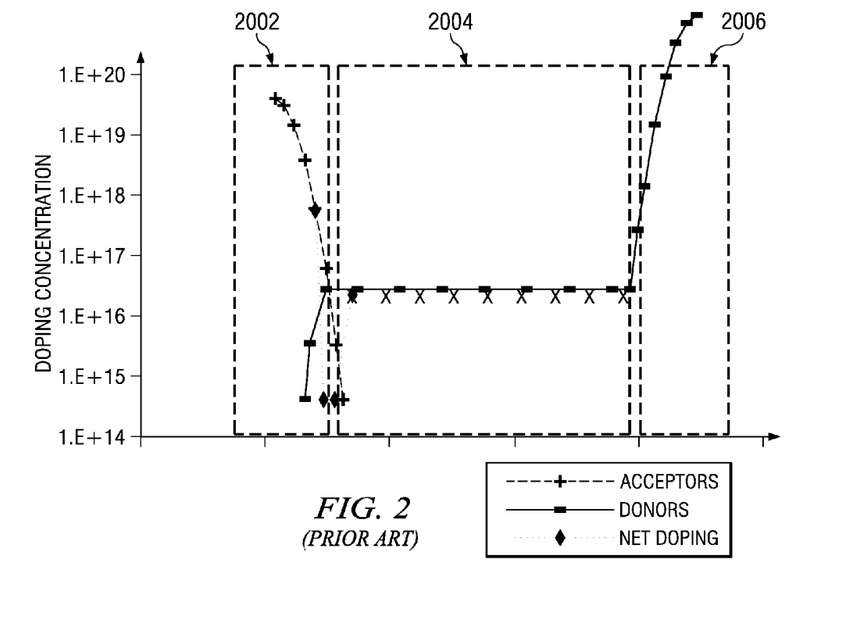
FIG. 2 shows a dopant profile of a conventional diode.

The doping profile for a convention diode is illustrated in FIG. 2. The doping profile 2002 in FIG. 2 corresponds to p-type doped region 1006 in FIG. 1. The doping profile 2003 in FIG. 2 corresponds to n-type doped region 1014 and doping profile 2006 corresponds to n-type doped region 1018. Note that the n-type donor concentration is approximately 2E16 in region 2004 and p-type acceptor concentration is less than 1E14. The critical field for this diode is approximately 0.4 MV/cm and the resistivity is about 0.45 mΩ*cm.

One way to increase Vb is to reduce the doping. For example, if the doping of the p-type region 1006 is reduced, the width of the p-type depletion region 1008 is increased and the applied voltage 1018 is dropped across a wider depletion region. This reduces the electric field gradient and therefore reduces the acceleration of the carriers in the depletion region. One problem with reducing doping is that resistance is increased. If the pwell resistance is increased in an integrated circuit, more substrate contacts may be required causing an increase in integrated circuit area which negatively impacts die cost.

According to one embodiment of the invention, the series resistance of a diode may be reduced while maintaining the breakdown voltage by increasing the net (donor minus acceptor) doping and by reducing the mean free path with additional scattering centers. The mean free path of an electron being accelerated must be sufficient for it to gain enough kinetic energy to cause impact ionization. When the mean free path is reduced, a higher voltage gradient is required for the electron to gain sufficient kinetic energy to cause impact ionization in the shorter distance. One method of reducing the mean free path is by adding scattering centers to the depletion region 1022 in FIG. 1, using counterdoping. The reduction of the mean free path enables an increase in the net doping producing a reduction series resistance while keeping the breakdown voltage the same.

Figure 3:
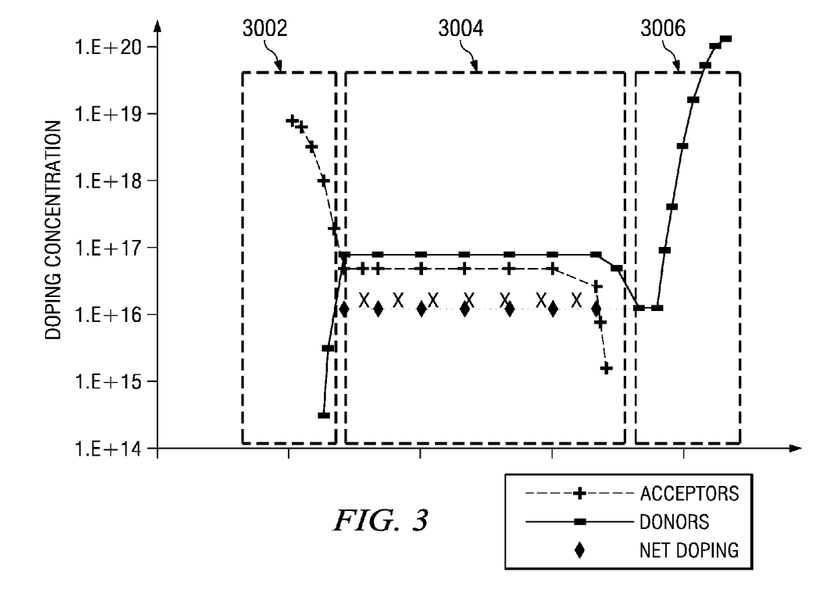
FIG. 3 shows a dopant profile of a diode according to an embodiment of the invention.

An example doping profile to illustrate this embodiment is shown in FIG. 3. In doping region 3004, the donor concentration is raised from $1E16/cm^3$ to approximately $5E16/cm^3$ (when compared with the donor doping in FIG. 1) and the acceptor concentration is raised from less than $1E14/cm^3$ to approximately $3E16/cm^3$. The total doping (donor concentration plus the acceptor concentration) is raised to about $8E16/cm^3$ whereas the net doping (donor concentration minus the acceptor concentration) is raised from $1E16/cm^3$ to $2E16/cm^3$. Increasing the number of scattering centers from approximately $1E16/cm^3$ to approximately $8E16/cm^3$ raises the critical field at which impact ionization begins from approximately 0.4 MV/cm to approximately 0.57 MV/cm. Additionally, the depletion region 1022 resistance is lowered from about 0.45 mΩ*cm to about 0.25 mΩ*cm. In an example embodiment, the counterdoping acceptor concentration may be between 0.2 and 0.9 times the donor concentration.

The critical field may be increased even higher by increasing total (donor plus acceptor) dose while adjusting the net (donor minus acceptor) dose accordingly. The maximum manufacturable amount of counter doping may be determined by the control of the doping levels in an implanter or in an epi reactor.

A second method of reducing the mean free path is to add scattering centers to the depletion region 1020 by implanting neutral species such as silicon, germanium or carbon while still maintaining the same active doping concentration. For example, approximately $6E16/cm^3$ germanium atoms may be added by ion implantation to raise the scattering center concentration from approximately $1E16/cm^3$ to approximately 8E16/cm3. This increase in scattering center concentration may raise the critical field at which impact ionization avalanche begins from approximately 0.4 MV/cm to approximately 0.57 MV/cm. This method is not limited by implanter control so higher scattering center levels may be achieved adding neutral species.

Adding scattering centers by counter doping or by adding neutral species may be performed separately or counterdoping plus added neutral species may be implemented together.

Raising the critical field raises the breakdown voltage, Vb. Vb may be reduced to the original low scattering center value by increasing the doping which has the added advantage of reducing diode resistance.

Another embodiment may be to raise the voltage handling capability of a DEMOS transistor or to improve the performance of a DEMOS transistor.

The term "drift region" refers to the region in a lightly doped drain extension which is charge neutral at low drain voltages but gets depleted at high drain voltages. In an extended drain MOS transistor (DEMOS), the voltage drop across this depleted region enables a low voltage transistor to switch a high voltage.

Figure 4:
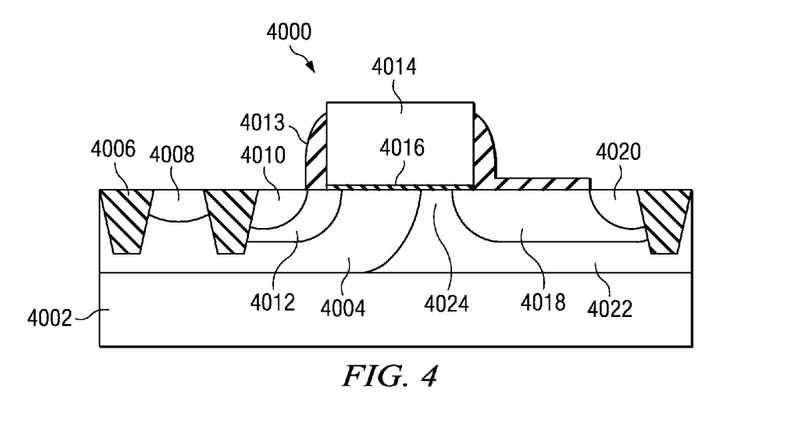
FIG. 4 shows a cross-sectional view of DEMOS transistor according to an embodiment of the invention.

An example horizontal DENMOS transistor 4000 in FIG. 4 is used to illustrate the embodiment. Lightly doped drain extension drift region 4018 depletes when a high voltage is applied to the drain contact 4020, dropping sufficient voltage across the extended drain 4018 to prevent damage to the low voltage gate oxide 4016. The DENMOS transistor 4000 is built in p-type substrate 4002 and includes shallow trench isolation 4006, a pwell 4004, a lightly doped p-type region 4022, a p+ substrate contact 4008, an n− doped source lightly doped source extension 4012, an n+ doped source diffusion 4010, a transistor gate 4014 with sidewalls 4013, and an n+ doped drain diffusion 4020.

The length and doping of the drift region 4018 is determined by the voltage to be dropped between the heavily doped drain diffusion 4020 and the transistor gate 4014. The doping must be light enough so that the drain extension fully depletes and long enough so that sufficient voltage is dropped before the depletion region reaches the n+ doped drain diffusion 4020. Lighter doping and a longer drain extension both add series resistance resulting in performance degradation.

Figure 7:
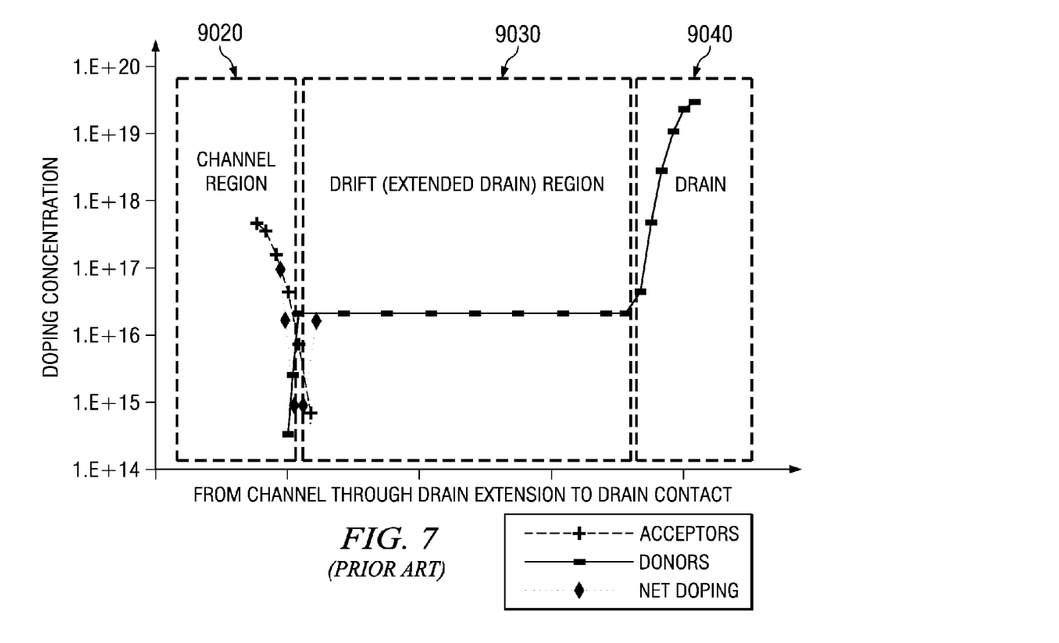
FIG. 7 shows a dopant profile of a conventional DENMOS.

An example doping profile for a conventionally designed DENMOS transistor is shown in FIG. 7. The doping profile 7020 represents the doping in the transistor channel 4024, the doping profile 7030 represents the doping in the drift region 4018, and the doping profile 7040 represents the doping in the drain 4020. Note that the n-type (donor) concentration in the drift region 7030 is in the 1E16/cm$^3$ range whereas the p-type (acceptor) concentration orders of magnitude less (less than 1E14/cm$^3$).

Figure 5:
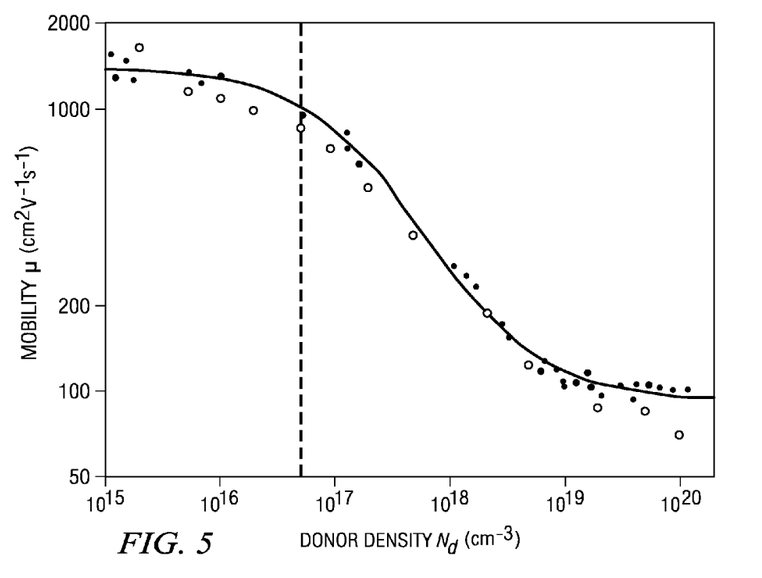
FIG. 5 is a graph of carrier mobility vs dopant density.
Figure 6:
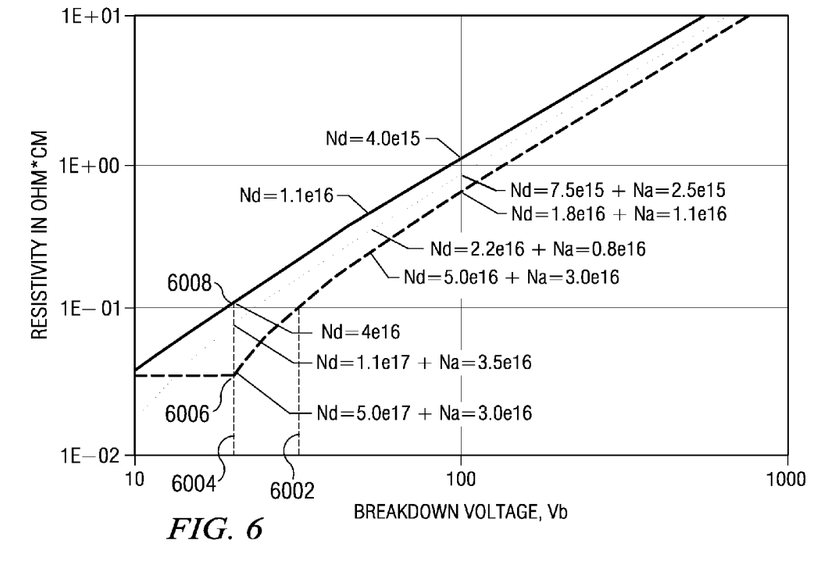
FIG. 6 is a graph of resistivity of a semiconductor vs the breakdown voltage for several doping and counterdoping concentrations.

Resistance, Rs, of the drain extension 4018 is inversely proportional to the carrier mobility and is inversely proportional to the active doping concentration. As shown in FIG. 5, the doping density may be increased to the mid $10^{16}$ range with little negative impact on mobility. FIG. 6 is a plot of Rs versus Vb of the drain extension for different levels of counterdoping. At a constant resistivity of 0.1 mΩ*cm, Vb may be increased from about 20 volts 6004 to about 30 volts 6002 by changing the doping from approximately 4E16/cm$^3$ phosphorus to about 1.5E17/cm$^3$ phosphorus counter doped with 9E16/cm$^3$ boron or, at a constant Vb of 20 volts 6004, Rs may be reduced from 0.1 mΩ*cm 6008 to about 0.04 mΩ*cm 6006.

As mentioned previously, the increase in scattering centers reduces the mean free path of the carriers, resulting in an increase in Vb. In addition to counter doping, an increase in scattering centers may be achieved by implanting neutral species such as Si, Ge, or C into the drain extension. The addition of scattering centers may be accomplished by counterdoping, by adding neutral species, or by a combination of counterdoping plus the addition of neutral species.

The dopants in a counter doped drain extension may be introduced by ion implantation or may be introduced during epitaxial growth. An embodiment of adding scattering centers to improve Vb of a DEMOS is illustrated using FIG. 4. The breakdown voltage, Vb, of the extended drain drift region 4018 may be increased by adding scattering centers either through counterdoping, by implanting neutral scattering centers such as Si, Ge, or C, or by a combination of counterdoping and implanting neutral scattering centers. The preferred method for adding scattering centers to the extended drain is with ion implantation, however, another option may be to etch the silicon from the extended drain area and epitaxially regrow the silicon with a counter doped profile.

Figure 8:
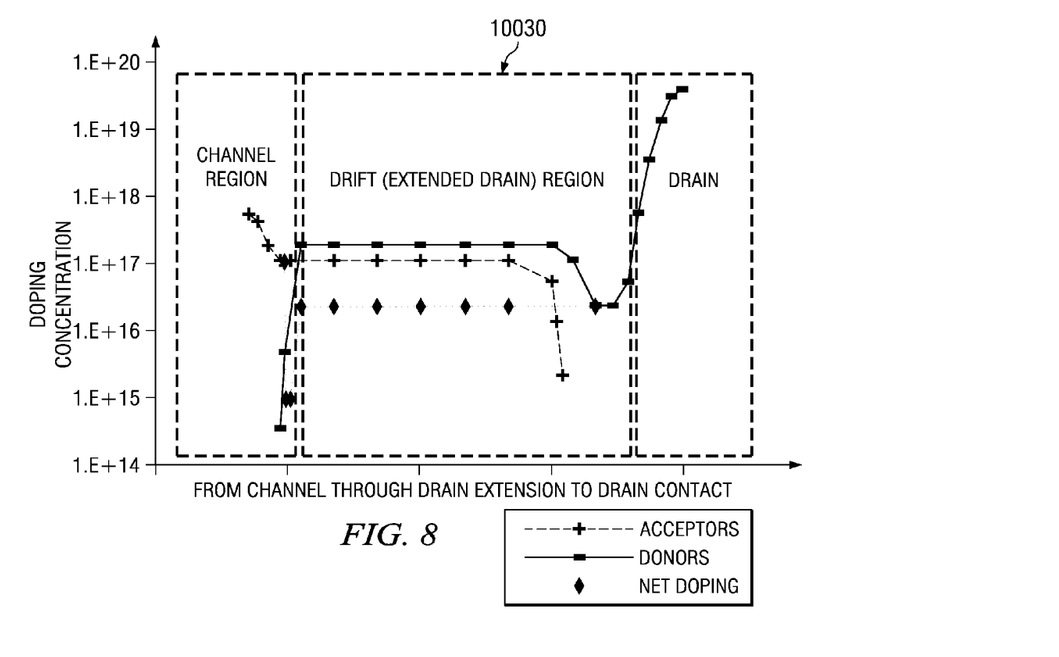
FIG. 8 shows a dopant profile of a DENMOS according to an embodiment of the invention.

The doping profile of a counterdoping embodiment is shown in FIG. 8. The doping profile 8030 of drift region 4018 is shown to consist of approximately 5.0E16/cm$^3$ n-type (donor) atoms and approximately 3.0E16/cm$^3$ p-type (acceptor) atoms. In contrast to FIG. 7, where the total doping (donor plus acceptor) in the drift region is approximately equal to the net doping (donor minus acceptor) concentration of 1E16/cm$^3$, in this example embodiment the total doping is equal to approximately 8.0E16/cm$^3$ whereas the net doping is equal to 2E16/cm$^3$. This 8-fold increase in concentration of scattering centers raises the critical field from approximately 0.4 MV/cm to approximately 0.57 MV/cm. The lower series resistance may allow the designer to reduce the length of the drift region reducing area and cost of the DEMOS and improving performance.

Figure 9:
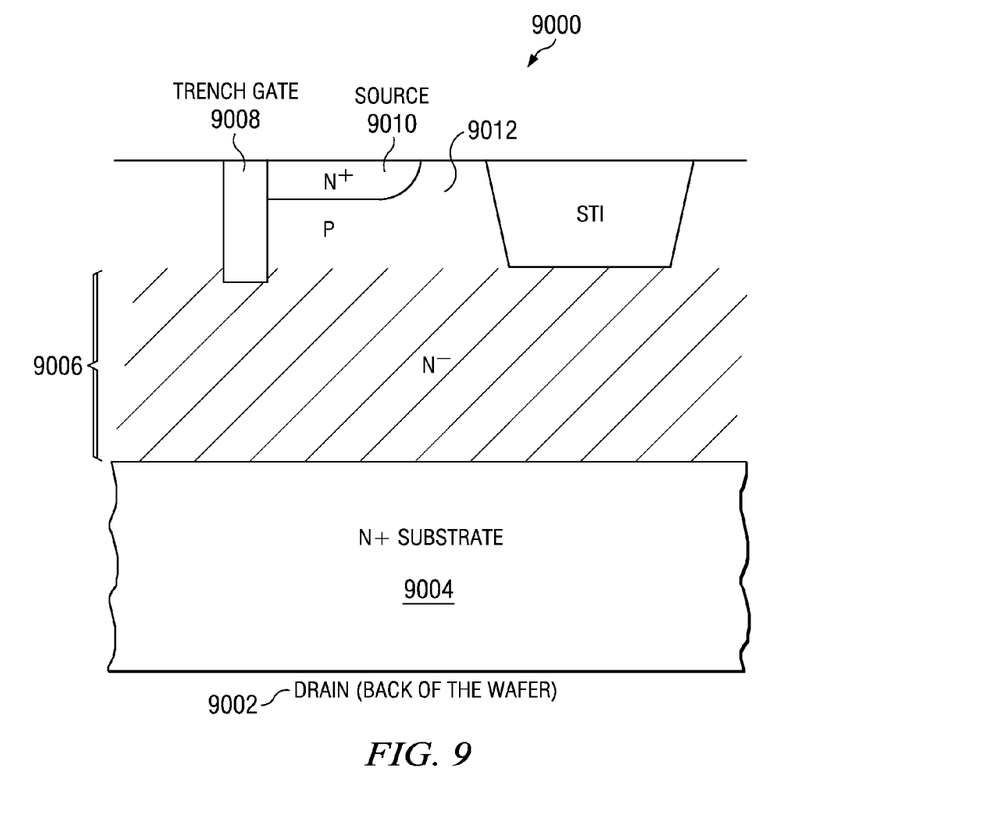
FIG. 9 is a cross-sectional view of a vertical DEMOS transistor according to an embodiment of the invention.

Another example embodiment showing a pseudo-vertical DENMOS is shown in FIG. 9. In this vertical DENMOS, a high voltage may be applied to the n+ drain 9002 and the voltage dropped across the n+ substrate 9004 and the n− doped extended drain 9006. The transistor gate 9008 turns on the nmos transistor between the extended drain 9006 and the n+ source 9010. The doping profile in the extended drain drift region 9006 may be precisely controlled during the epitaxial growth of this layer. A counter-doped extended-drain drift region 9006 may be formed with a significantly higher breakdown voltage, Vb, than a non counter-doped extended-drain drift region. Additional neutral scattering centers such as Si, Ge, and C may be added to region of peak electrical field in the extended drain drift region 9006 with ion implantation to additionally raise Vb.

The invention is illustrated using horizontal and vertical DENMOS transistors, but horizontal and vertical DEPMOS transistors may also benefit from the instant invention. The design of the DEMOS examples is for illustrative purposes only. Many other DEMOS transistor designs may also be used.

Figure 10:
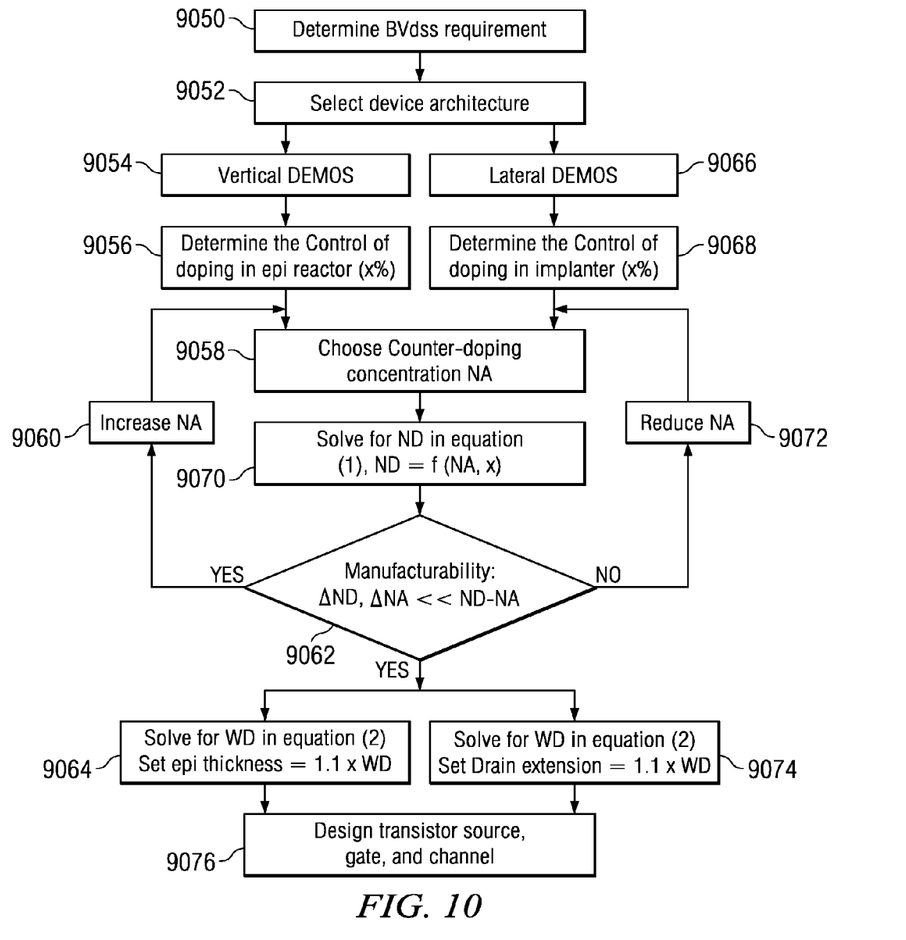
FIG. 10 is a flowchart illustrating a method for designing a counterdoped DEMOS transistor according to an embodiment of the invention.

A method for the design of a DEMOS counter-doped extended-drain drift region is given in FIG. 10. Step one 9050 is to determine the breakdown voltage, Vb, required for the DEMOS. This breakdown voltage may also be referred to as BVdss. Step two 9052 is to select the type of DEMOS device to be formed.

The vertical DEMOS device 9054 design procedure is described in steps 9056 through 9064. An DENMOS device is used for illustration, but a DEPMOS device may equally well be used.

Step 9056 is to first determine the doping capability of the epi reactor to control the net doping (donor minus acceptor) concentration and the total doping (donor plus acceptor) concentration within the device specification limits.

In step 9058, the acceptor counderdoping concentration is chosen based upon the epi reactor capabilities and the device voltage requirements.

The donor concentration may then be calculated in step 9070 using empirical equations linking the breakdown voltage, Vb, to the doping concentration $N_D$. (S. M. Sze, "Physics of semiconductor devices", John Wiley & Sons, Inc., 1981, pp 100-102)

$$Vb \approx \frac{130 E_{crit}^2}{(N_D - N_A)}$$

$E_{crit}$, the maximum electric field at breakdown is approximately given by $$E_{crit} \approx \frac{0.4}{1 - \frac{1}{3}\log(N_D + N_A)}$$

These equations may be inverted and approximately solved for $N_D$ as in the following equation:

$$N_D \approx \frac{400E_{crit}^{1.5}}{V_b^{1.5}} + N_A\left(1 + \frac{10E_{crit}}{V_b}\right)$$

In step 9062, the manufacturability is checked by determining if the control of the donor and acceptor dopants is sufficient to keep the net doping, donor minus acceptor concentration, within specification limits. If manufacturability limits are not met it may be necessary to choose a lower counter-doping acceptor concentration 9072, and repeat steps 9058, 9070, and 9062. If, on the other hand, the manufacturability criteria are met, two choices are possible: 1. If there is more than ample manufacturing margin, it may be desirable to use some of the margin to additionally increase the counterdoping concentration to additionally improve Vb. In this case, the donor concentration may be increased 9060 and steps 9058, 9070, and 9062 may be repeated; 2. If the manufacturing margin is acceptable, proceed to step 9064.

If the manufacturability criteria are met, the approximate thickness required for the epi layer may be determined by calculating the approximate width of the depletion region, WD, in step 9064 using an equation such as:

$$WD \approx \frac{2.6}{(N_D - N_A)\left[1 - \frac{1}{3}\log(N_D + N_A)\right]}$$

The thickness of the epi layer may be approximately 1.1 times the calculated WD.

This completes the design of the extended drain drift region for a vertical DENMOS. The remaining regions of the DENMOS may be simulated in step 9076.

The design of a lateral DEMOS transistor 9066 is illustrated in steps 9068 through 9074 in the example embodiment. A lateral DENMOS is used for illustration, but a lateral DEPMOS may also be used.

Step 9068 determines the doping capability of the implanter to control the net doping (donor minus acceptor) and total doping (donor plus acceptor) concentrations within the device specification limits.

In step 9058, the acceptor counderdoping concentration is chosen based upon the implanter capabilities and the device voltage requirements.

The donor concentration is then calculated in step 9070 as is described above for a vertical DENMOS transistor 9054.

In step 9062, the manufacturability is checked by determining if the control of the donor and acceptor concentrations is sufficient to keep the net doping, donor minus acceptor concentration, within specification limits. If manufacturability limits are not met it may be necessary to choose a lower counter-doping acceptor concentration 9072, and repeat steps 9058, 9070, and 9062. If, on the other hand, the manufacturability criteria are met, two choices are possible: 1. If there is more than ample manufacturing margin it may be desirable to use some of the margin to additionally increase the counter doping concentration to additionally improve Vb. In this case the donor concentration may be increased 9060, and steps 9058, 9070, and 9062 may be repeated; 2. If the manufacturing margin is acceptable, proceed to step 9074.

If the manufacturability criteria are met, the approximate length required for the extended drain drift region may be determined by calculating the width of the depletion region, WD, as is previously described for vertical DENMOS transistor, 9064. The extended drain drift region length may be approximately 1.1 times the calculated WD.

The above method and equations within the embodiment are given to illustrate the embodiment and not intended to limit the method. For example, other more or less detailed equations or simulation software may be used to calculate the $N_D$, WD, and Vb. In addition, the embodiment technique may be used to design counterdoped drift regions in diodes and other types of transistors.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of fabricating an integrated circuit, comprising the step of:
    forming a drift region between a gate and a drain of a DEMOS transistor;
    wherein at least 10 percent of a length of said drift region between said gate and said drain consists of a concentration of a first dopant type plus a concentration of scattering centers; and
    wherein said concentration of said scattering centers is greater than said concentration of said first dopant type divided by 5.

2. The method of claim 1, wherein said concentration of said scattering centers is a dopant of a second dopant type.

3. The method of claim 2, wherein said concentration of said first dopant type is an n-type dopant in the range of $1E15/cm^3$ to $1E18/cm^3$ and wherein said second dopant type is a p-type dopant with a concentration between 0.2 and 0.9 of said first dopant type concentration.

4. The method of claim 3, wherein said concentration of said n-type dopant is about $5E16/cm^3$ and wherein said concentration of said second dopant type is about $3E16/cm^3$.

5. The method of claim 1, wherein said concentration of said scattering centers is silicon, germanium, or carbon.

6. The method of claim 5, wherein said concentration of said first dopant is between $1E15/cm^3$ to $1E18/cm^3$ and wherein said concentration of said scattering centers is between $1E15/cm^3$ to $1E18/cm^3$.

7. The method of claim 6, wherein said concentration of said first dopant is about $2E16/cm^3$ and wherein said concentration of said scattering centers is about $6E16/cm^3$.

8. The method of claim 1, wherein a first portion of said concentration of said scattering centers are a second dopant type, wherein a concentration of said second dopant type is between 0.2 and 0.9 times the said concentration, and wherein a second portion of said scattering centers are at least one of silicon, germanium, and carbon.

9. A method of fabricating an integrated circuit, comprising the step of:
    forming a gate of a DEMOS transistor over a substrate;
    forming a source and drain of the DEMOS transistor in the substrate;
    forming a drift region the DEMOS transistor between the gate and drain by:

implanting a first dopant type into a region of the substrate; and adding a concentration of scattering centers by counterdoping the region with a second dopant type, wherein at least 10 percent of a length of said drift region between said gate and said drain consists of a concentration of a first dopant type plus a concentration of scattering centers; and wherein said concentration of said scattering centers is greater than said concentration of said first dopant type divided by 5.

10. The method of claim 9, wherein said concentration of said first dopant type is an n-type dopant in the range of $1E15/cm^3$ to $1E18/cm^3$ and wherein said second dopant type is a p-type dopant with a concentration between 0.2 and 0.9 of said first dopant type concentration.

11. The method of claim 9, wherein said concentration of said n-type dopant is about $5E16/cm^3$ and wherein said concentration of said second dopant type is about $3E16/cm^3$.

* * * * *